United States Patent [19]

Fuchs et al.

[11] Patent Number: 5,100,518
[45] Date of Patent: Mar. 31, 1992

[54] METHOD AND APPARATUS FOR PLATING INSULATING STRIP

[75] Inventors: Harold E. Fuchs; Robert E. McAnany, both of Kansas City, Mo.

[73] Assignee: AT&T Bell Laboratories, Murray Hill, N.J.

[21] Appl. No.: 631,295

[22] Filed: Dec. 20, 1990

[51] Int. Cl.$^5$ ............................................. C25D 17/00
[52] U.S. Cl. .................................... 205/138; 205/148; 205/166
[58] Field of Search ............................................. 204/28

[56] References Cited

U.S. PATENT DOCUMENTS 4,242,181 12/1980 Malak ................................. 204/52.1
4,360,410 11/1982 Fletcher et al. ....................... 204/23
4,781,799 11/1988 Herbert, Jr. et al. ................... 204/9
4,806,107 2/1989 Arnold et al. .......................... 439/79

Primary Examiner—T. M. Tufariello
Attorney, Agent, or Firm—L. H. Birnbaum

[57] ABSTRACT

Disclosed is a method and apparatus for achieving a uniform coating of metal, such as copper, on an insulating strip, such as polyimide. After activating the surface, the strip is passed through a plating cell which includes a pumped solution mixed with a gas to achieve frothing. A high current is supplied to the cathode, so a cooled cathode construction is provided to prevent burning of the strip. Further features of the apparatus include a means for splicing strips, and a cantilever beam cathode contact for improving the physical contact with the strip.

12 Claims, 7 Drawing Sheets

METHOD AND APPARATUS FOR PLATING INSULATING STRIP

BACKGROUND OF THE INVENTION

This invention relates to a method and apparatus for plating a strip.

Several applications presently exist for flexible, insulating material coated with a metal. Chief among them are the contact fingers in Tape Automated Bonding (TAB), and flexible circuits such as those used in certain connectors (see U.S. Pat. No. 4,806,107 issued to Arnold et al) and in laminated printed circuit boards. In many such applications, the insulating material is processed in the form of a wide (typically 14 inches) continuous strip. Difficulties have been encountered in providing a uniform coating on such a wide strip. Further, in most applications, it is desirable to produce a coated strip which has an elongation of at least 10 percent.

It is generally known to plate a printed circuit board with copper by means of a copper sulfate bath, and elongations up to 23 percent have been reported (see, e.g., U.S. Pat. No. 4,242,181 issued to Malak). Electroforming processes have also been described involving high current densities, agitation of the bath, and achievement of elongation of 12-14 percent (see U.S. Pat. No. 4,781,799 issued to Herbert, Jr. et al). Finally, it is generally known to form a foaming electrolyte by pumping a gas therein (see, U.S. Pat. No. 4,360,410 issued to Fletcher et al).

It does not appear, however, that anyone has previously taught how to consistently achieve a uniform coating of a wide insulating strip with high elongation.

SUMMARY OF THE INVENTION

These and other objectives are achieved in accordance with the invention which, in one aspect, is a method of forming a metal coating on an insulating strip. The method comprises making electrical contact to the strip by means of a cathode, and transporting the strip through a plating bath. A current density of at least 0.1 amps/cm$^2$ is applied to the cathode. The bath is agitated by introducing a gas therein at a rate of at least 5 cubic cm minute per cm$^3$ of plating solution.

In accordance with another aspect, the invention is an apparatus for plating metal on an insulating strip comprising a cathode for making electrical contact to the strip. The cathode includes a cantilever member for physically contacting an area of said strip. Means are also provided for cooling the cathode during the plating operation. The apparatus further includes a plating cell and means for introducing a gas into the cell.

BRIEF DESCRIPTION OF THE DRAWING

These and other features of the invention are delineated in detail in the following description. In the drawing.

It will be appreciated that for purposes of illustration these figures are not necessarily drawn to scale.

DETAILED DESCRIPTION

Figure 1:
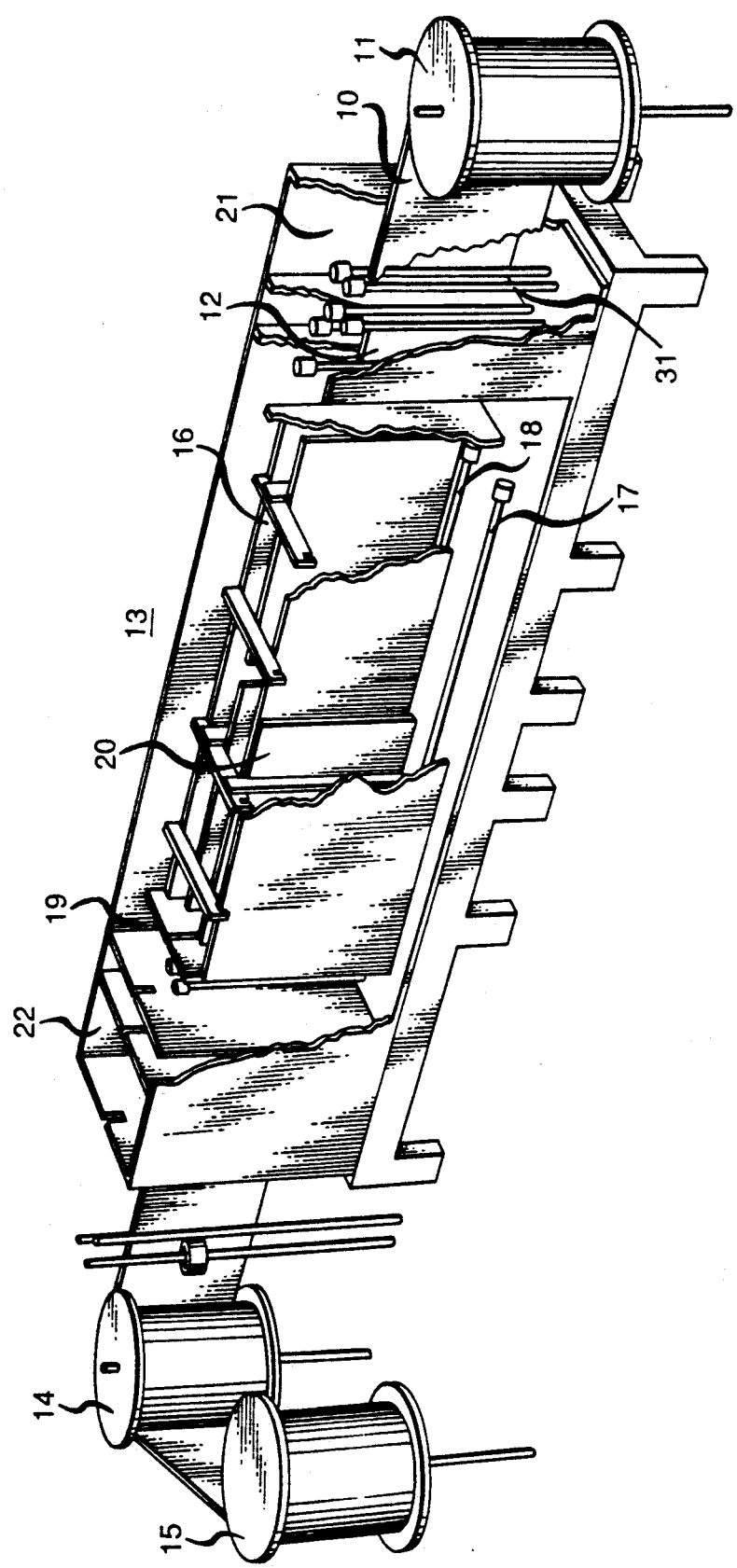
FIG. 1 is a perspective view, partly cutaway, of an apparatus for plating a strip in accordance with an embodiment of the invention.

Prior to the practice of the invention, the insulating strip which is to be coated with metal has its surfaces activated in order to form a thin layer of metal thereon for contacting purposes. In the example of a polyimide strip which is to be copper coated, the surfaces are typically precoated with a thin layer of nickel and copper to a combined thickness of approximately 0.002 mm. As shown in FIG. 1, the activated strip, 10, is provided on a spool, 11, and is installed in the apparatus as shown. The strip is typically approximately 35 cm wide and approximately 0.05 mm thick, but the invention is useful for any strip with a width of at least 10 cm and thicknesses above 0.02 mm. The strip is passed through a cathode contact, 12, and into a plating cell 13. The strip emerges from the plating cell at the other end and is guided by another spool, 14, and taken up by a third spool 15.

The plating cell includes an inner chamber, 16, into which the plating solution (not shown) is introduced by means of spray nozzles, 17 and 18, and an outer chamber, 19, into which the plating solution will spill over. The plating cell further includes a plurality of vertically disposed anodes such as 20. In this example, two anodes are provided adjacent to each surface of the strip (one of the anodes being removed in the figure for illustrative purposes).

Immediately preceding the plating cell is a chamber, 21, where the strip will undergo a standard acid activation, and immediately following the plating cell is a chamber, 22, for cleaning the plated surfaces of the strip by means of deionized water.

Figure 2:
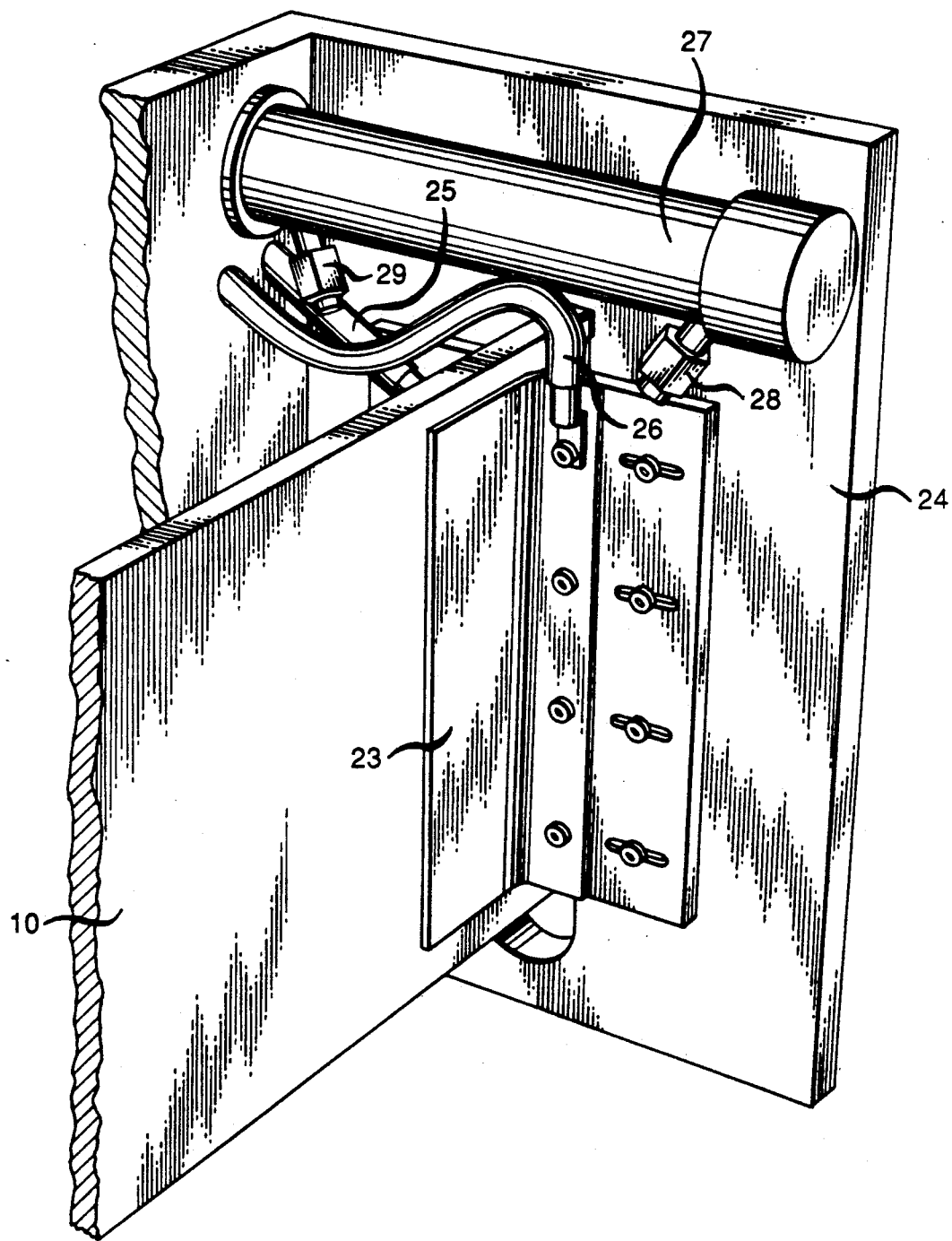
FIG. 2 is an enlarged perspective view of a portion of the apparatus of FIG. 1.

FIG. 2 illustrates in an enlarged, perspective view, the structure of the cathode contacts employed in the plating process. The cathode contact includes two cantilevered conductive elements, each making contact to a corresponding surface of the strip 10. (Thus, in the view of FIG. 2, only one of the conductive elements, 23, is visible.) Each conductive element, which in this example is made of beryllium-copper, is screwed to a wall 24 which separates the chambers of the apparatus and which includes a slot for the strip to pass through. Electrical contact is made to the conductive elements by means of leads 25 and 26. Cooling, deionized water, is provided to the cathode by means of a pipe, 27, and two nozzles, 28 and 29. Each nozzle is directed to a corresponding conductive element so that a spray is incident thereon during the plating operation.

Each conductive element, 23, when not contacting the strip, takes he form of a uniformly loaded cantilever beam which curves toward the strip (i.e., forms a convex surface with respect to the strip). When the strip is introduced, the cantilever elements will be loaded into flat positions as shown, thereby exerting a uniform pressure against the surfaces of the strip. This ensures that the conductive elements will each contact an area of the strip surface rather than just a point or a line on the surface. This area contact is important in the present invention where high current is desirable which might otherwise burn the strip surface if the current were not distributed over a significant area. In a typical example, the conductive elements each have a radius of curvature, before contact, in the range 50–100 cm, a length of 25–30 and contact an area of the strip of approximately 200 cm$^2$.

Figure 3:
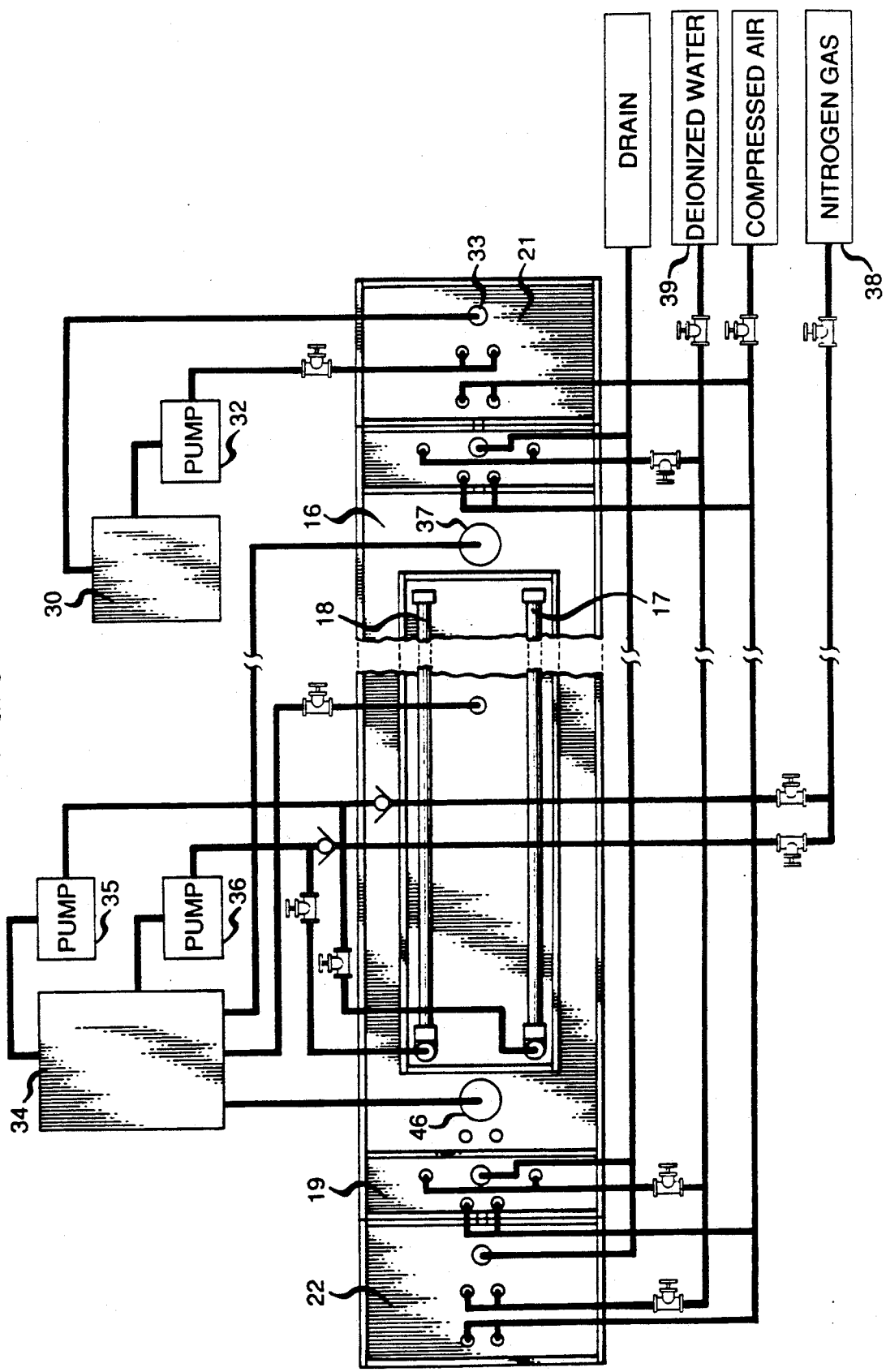
FIG. 3 is a plan view of a portion of the apparatus of FIG. 1.

The basic method of the invention will now be described with further reference to FIG. 3, which is a plan view of a portion of the apparatus illustrating the piping configuration for the plating operation.

As alluded to previously, before the strip enters the plating cell, 16, it first undergoes an acid activation in chamber 21. An acid, which in this example was dilute sulfuric acid, was provided in reservoir 30 and fed to sprayers (31, of FIG. 1) by means of a pump, 32. The acid was collected in drain 33 and returned to the reservoir.

A plating solution from reservoir 34 was transported by means of a pair of pumps, 35 and 36, to the sprayers 17 and 18, respectively, and into the plating cell as the strip passed therethrough. The particular bath employed was primarily copper sulfate mixed with sulfuric, hydrochloric, and phosphoric acids. The concentration of the copper sulfate was approximately 184 gram/liter, and the concentrations of $H_2SO_4$, HCl, and $H_3PO_4$ were 59 gram/liter, 35–40 parts per million and 0.5 millimeters/liter, respectively. The bath was recirculated through drains 37 and 46.

Also coupled to the sprayers, 17 and 18, was a source of nitrogen gas 38. The nitrogen gas was introduced into the plating cell along with the bath in order to cause frothing of the bath during the plating operation. In order to provide uniform plating of the strip, it is important to choose the appropriate ratio of gas flow to plating bath. In this example, the gas was introduced at a rate of at least 1.5 m$^3$/min in order to give a ratio of 7 cm$^3$ per minute per cm$^3$ of plating solution. However, a ratio of at least 5:1 should be adequate. It will be appreciated that other gases, such as air and argon may be used in place of nitrogen.

While the bath and gas were being pumped into the cell, a high current density was applied to the cathode. The current density should be sufficient to result in uniform plating over the entire surfaces of the strip. In particular, it was found that a current density in the range of 1000–1300 amps/m$^2$ was sufficient. As previously alluded to, current densities of this magnitude required cooling of the cathode in this example by pumping water (from source 39) to the nozzles (28 and 29 of FIG. 2) aimed at the conducting elements of the cathode. It will be appreciated that a second cathode contact (not shown) was also provided in chamber 19 as the strip exited the plating cell and, consequently, water was also pumped therein from source 39.

Deionized water was also pumped into the last chamber, 22, along with compressed air (CA) in order to clean the strip after it emerged from the plating cell.

As a result of the above-described plating operation, the strip, 10, had a layer of copper formed on both major surfaces to a thickness of approximately 0.036 mm with a thickness variation of only ±10 percent across the entire width of the strip. Elongation was greater than 15 percent. While one would ordinarily expect a columnar structure for the copper when a DC current was used, the copper layer, in fact, started as a columnar structure near the surface of the strip, but then changed to a laminar structure and then back to a columnar structure as the thickness increased. It is believed that this combination of structure is, at least in part, responsible for the high elongation which was obtained.

Another important aspect of the invention is the ability to splice two strips together during the plating process. If electrical continuity across the spliced portion is not maintained, too much current could be concentrated at one of the cathodes and exceed the current carrying capacity of one of the strips resulting in damage to the strip. The strips are too thin (approximately 0.05 mm) to be reliably butt joined while ensuring electrical continuity of both surfaces between the two strips.

Figure 4:
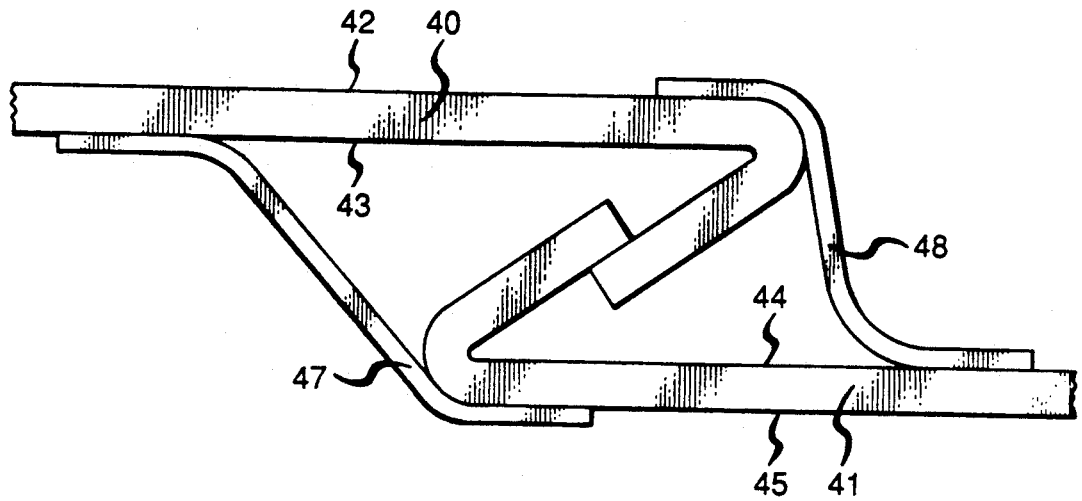
FIGS. 4 and 5 are side views of two strips spliced together in accordance with alternative embodiments of the invention.
Figure 5:
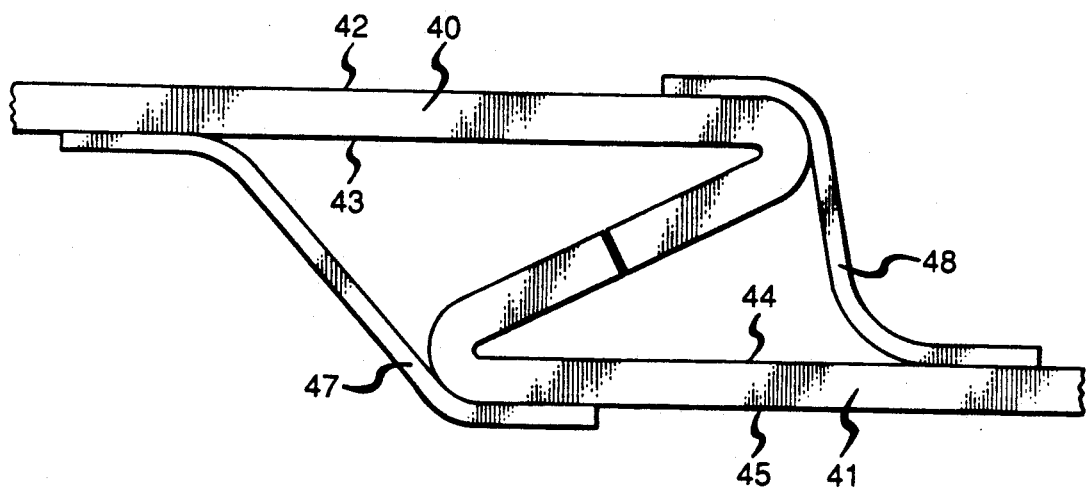

Consequently, joints such as those shown in FIGS. 4 and 5 are recommended. Both joints involve a folding of the two strips, 40 and 41, which are to be joined. In the case of FIG. 4, hereinafter referred to as the folded lap joint, the bottom surface, 43, of the first strip, 40, is in direct contact with the top surface, 44, of the second strip 41. When the joint is flattened, direct contact will exist between the bottom surface 43 of the first strip and the bottom surface, 45, of the second strip. Direct contact between the top surface, 42, of the first strip and the top surface, 44, of the second strip will also exist when the joint is flattened. Thus, all four sides are electrically connected.

In FIG. 5, hereinafter referred to as the folded butt joint, where similar elements are similarly numbered, initially no surface on the first strip directly contacts a surface on the second strip. However, when flattened the top surface, 42, of the first strip directly contacts the top surface, 44, of the second strip, 41, while the bottom surface, 43, of the first strip, 40, directly contacts the bottom surface, 45, of the second strip, 41. Thus, the top and bottom surfaces of the two strips are not interconnected in this embodiment.

Figure 6:
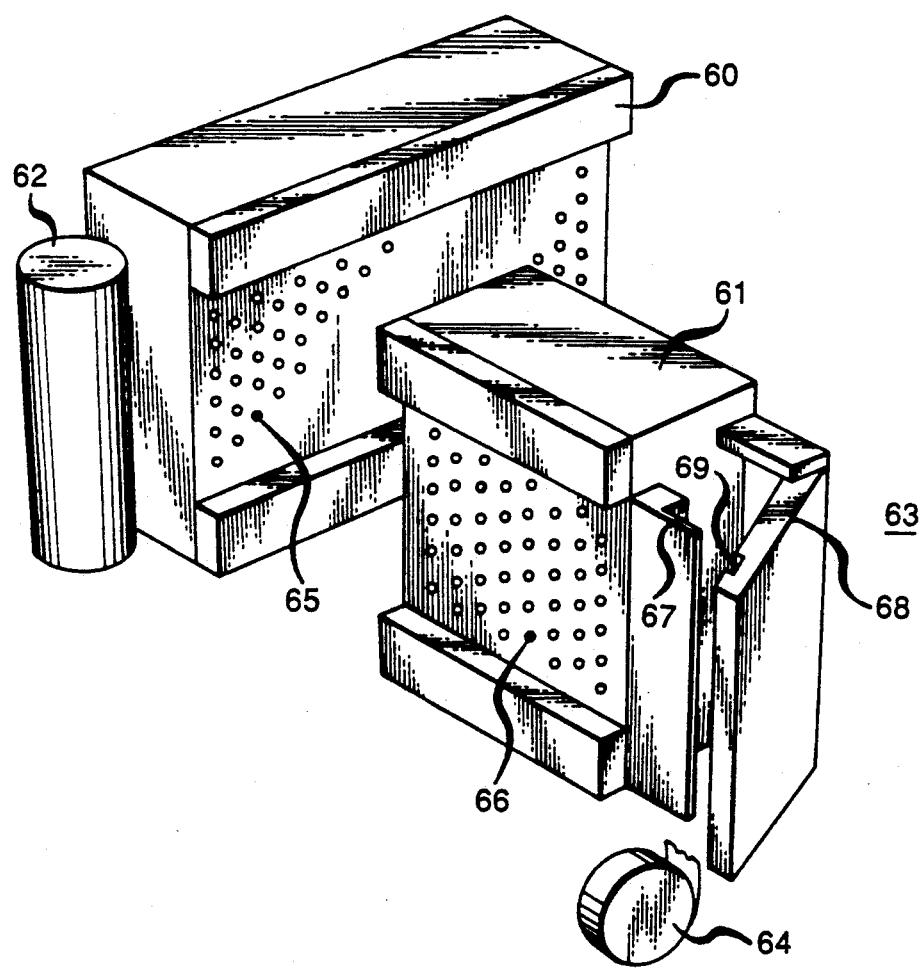
FIG. 6 is a perspective view of a portion of an apparatus in accordance with a further embodiment of the invention.

FIG. 6 illustrates, in a perspective view, apparatus which may be utilized to produce the joints of FIGS. 4 and 5. The apparatus includes a vacuum guide 60 and a fold-and-tape station, 61, essentially perpendicular thereto. The vacuum guide includes a guide reel 62 at its entrance end. The fold-and-tape station, 61, includes a fold fixture 63 at the end which is removed from the vacuum guide 60. The fold fixture includes a sharp-edged member 67 and a hinged member 68 with a slot 69 which engages the sharp-edged member when in a closed position to fold the tape along the sharp edge. Mounted inclose proximity to the fold fixture is a tape dispenser 64. A slight vacuum is applied by standard means (not shown) through holes, e.g., 65 and 66, in two of the major surfaces of the vacuum guide and fold-and-tape station.

Figure 7:
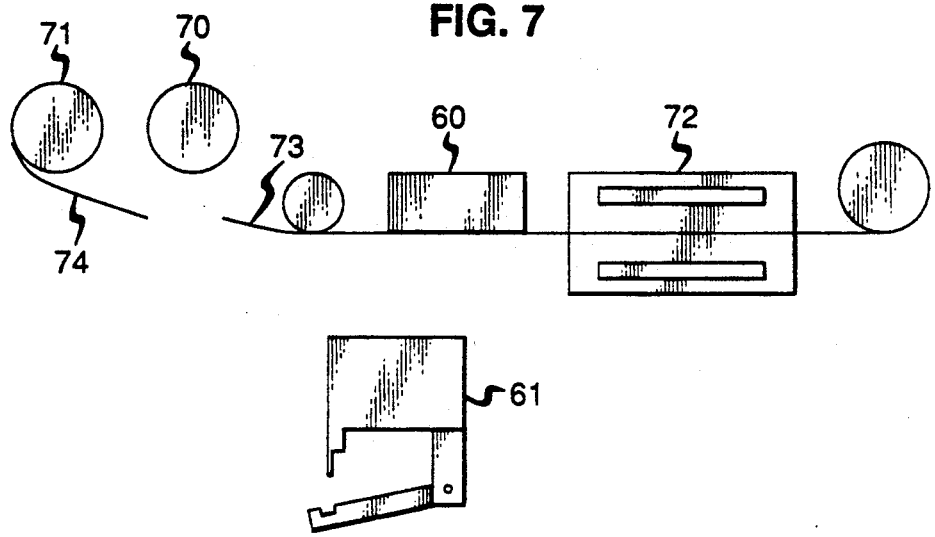
FIG. 7-10 are schematic plan views of the apparatus of FIG. 6 showing various stages of fabrication in accordance with the further embodiment.
Figure 8:
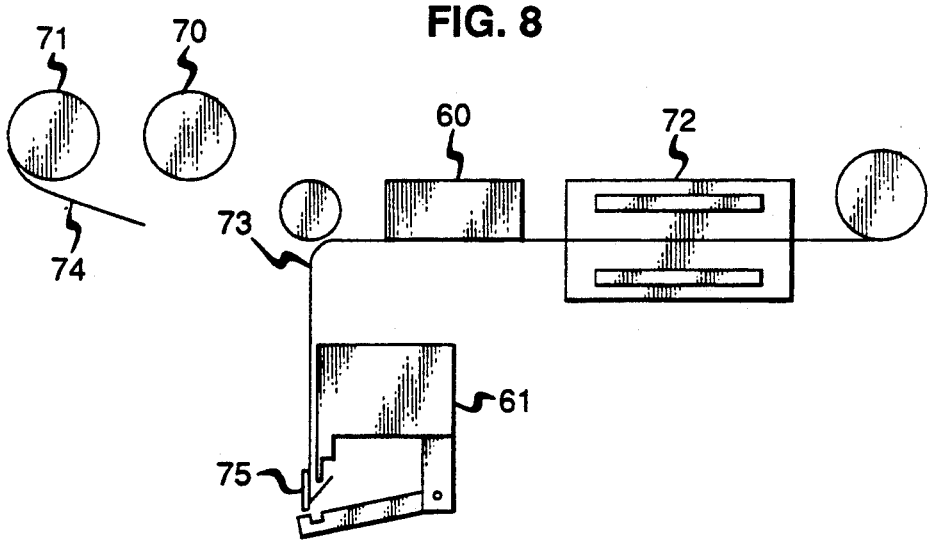
Figure 9:
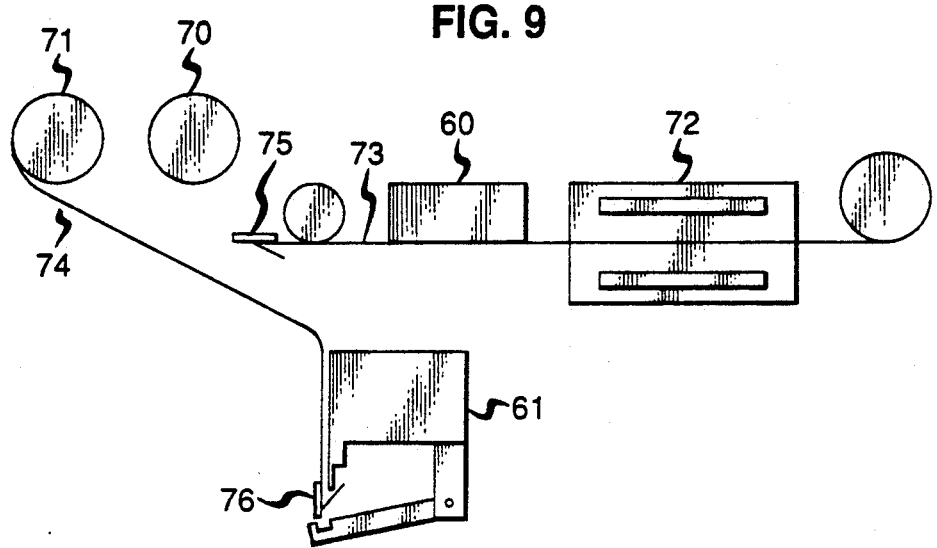

As illustrated in the schematic plan views of FIGS. 7–10, the splicing apparatus is positioned between two reels, 70 and 71, and the plating apparatus of FIG. 1, illustrated as box 72. FIG. 7 illustrates the point in time when the trailing edge of the strip 73 on reel 70 is about to enter the plating apparatus, and the leading edge of the strip 74 on reel 71 is about to be spliced thereon. As shown in FIG. 8, the trailing edge of strip 73 is brought into contact with the surface of fold-and-tape station 61 and held by the vacuum applied thereto so that the end is folded away from the surface facing the vacuum guide 60. The tape, 75, is then applied to the surface of the strip facing the vacuum guide. Strip 73 is then released from the station 61, and strip 74 from reel 71 is then taken up and held by the station as shown in FIG. 9. This time, however, the fold is made toward the surface of the strip 74 which will face the guide 60. Thus, the same fold and tape operation on the leading and trailing edges of the tapes results in "tails" facing in opposite directions. Again, tape, 76, is applied from the dispenser.

Figure 10:
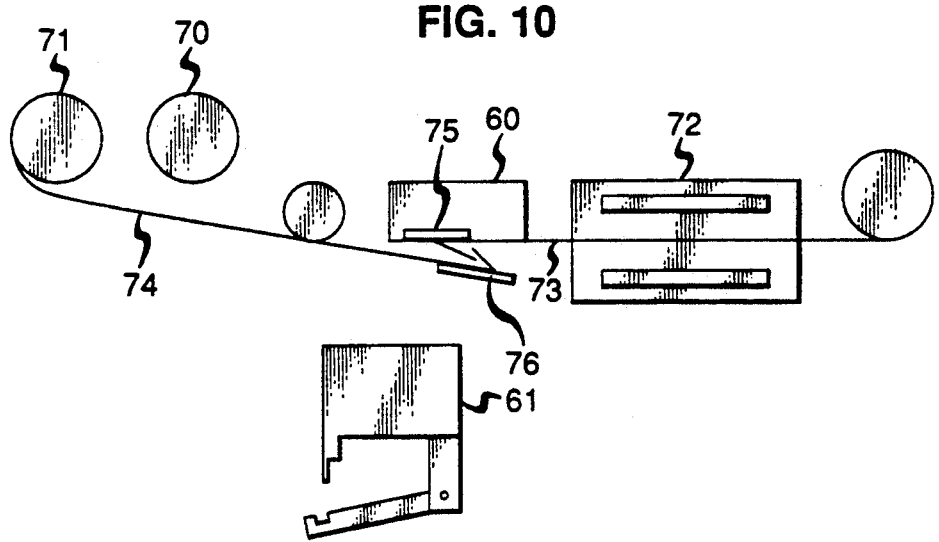

When the strip, 74, is released by the station 61, the folded edge of 74 is aligned with the folded edge of strip 73 while both strips are held by the vacuum guide, 60, as illustrated in FIG. 10. The two ends can be aligned in the folded lap joint configuration of FIG. 4, as shown in FIG. 10, or in the butt joint configuration of FIG. 5. The two strips, held together by tapes 75 and 76, are pressed together to flatten the strips and contact the surfaces of the strips.

Various modifications of the invention will become apparent to those skilled in the art. For example, although plating of a copper layer has been described, it is clear that other metal coatings such as nickel, gold, palladium or silver can be formed by varying the plating bath. Also, a single side of the strip can be plated rather than plating both sides as described. Further, insulating material other than polyimide, such as polyester and Mylar TM, may be plated. All such variations which basically rely on the teachings through which the invention has advanced the art are properly considered within the scope of the invention.

We claim:

1. A method for forming a metal coating on an insulating strip comprising the steps of:
   making electrical contact to the strip by means of a cathode;
   transporting the strip through a plating cell which includes a plating bath therein;
   applying a current density of at least 1000 amps/m² to the cathode; and
   agitating the bath by introducing a gas therein at a rate of at least 5 cubic cm per minute per cm³ of plating bath.

2. The method according to claim 1 wherein the metal coating comprises copper.

3. The method according to claim 2 wherein the plating bath comprises copper sulfate.

4. The method according to claim 1 wherein the gas is selected from the group consisting of air, argon and nitrogen.

5. The method according to claim 1 wherein the strip is at least 10 cm wide.

6. The method according to claim 1 further comprising cooling the cathode contact while the metal is being formed on the strip.

7. The method according to claim 6 wherein the cathode contact is cooled by directing water thereon.

8. The method according to claim 5 wherein the insulating strip comprises polyimide.

9. The method according to claim 8 wherein the variation in thickness of the coating is no greater than ±10 percent along the entire surface of the strip, and the elongation of the coated strip is at least 10 percent.

10. The method according to claim 1 wherein the insulating strip has a leading end and a trailing end, and further comprising the step of splicing a leading end of a second insulating strip onto the trailing end of the said insulating strip prior to transporting said trailing end into the plating cell.

11. The method according to claim 10 wherein the trailing end of the said insulating strip and the leading end of the second insulating strip are spliced by folding both ends, aligning said ends, and applying tape so that the surfaces of the two strips are electrically connected.

12. The method according to claim 1 wherein the cathode makes physical contact to an area of the strip surface which is at least 200 cm² in size.

* * * * *